United States Patent
Hong

[11] Patent Number: 5,703,387
[45] Date of Patent: Dec. 30, 1997

[54] SPLIT GATE MEMORY CELL WITH VERTICAL FLOATING GATE

[75] Inventor: Gary Hong, Hsin-Chu, Taiwan

[73] Assignee: United Microelectronics Corp., Hsin-Chu, Taiwan

[21] Appl. No.: 316,137

[22] Filed: Sep. 30, 1994

[51] Int. Cl.⁶ ............................................. G11C 13/00
[52] U.S. Cl. ............................................. 257/315; 257/321
[58] Field of Search ........................... 257/315, 321, 257/329, 330

[56] References Cited

U.S. PATENT DOCUMENTS

| | | | |
|---|---|---|---|
| 4,868,629 | 9/1989 | Eitan | 357/45 |
| 4,914,740 | 4/1990 | Kenney | 257/300 |
| 5,040,036 | 8/1991 | Hazani | 257/321 |
| 5,051,795 | 9/1991 | Gill et al. | 257/321 X |
| 5,115,288 | 5/1992 | Manley | 357/23.5 |
| 5,331,189 | 7/1994 | Chan et al. | 257/321 |
| 5,338,953 | 8/1994 | Wake | 257/321 X |
| 5,430,673 | 7/1995 | Hong et al. | 257/321 X |
| 5,506,431 | 4/1996 | Thomas | 257/321 X |
| 5,508,544 | 4/1996 | Shah | 257/321 X |

*Primary Examiner*—Do Hyun Yoo
*Attorney, Agent, or Firm*—Meltzer, Lippe, Goldstein, Wolf & Schlissel, P.C.

[57] ABSTRACT

A vertical split gate memory device has a semiconductor substrate with a trench and a floating gate formed on a sidewall of the trench, thus reducing the surface area of each memory cell. The fabrication process for this device allows precise control over the consistency during fabrication because the length of the floating gate is controlled by the depth of a trench etch and the location of the drains and sources are self-aligned by oxide spacers which act as masks during the doping process.

11 Claims, 4 Drawing Sheets

5,703,387

SPLIT GATE MEMORY CELL WITH VERTICAL FLOATING GATE

FIELD OF THE INVENTION

The present invention is directed to a split gate memory device and, more particularly, to an improved split gate device having a vertical floating gate and a method for making such a device.

BACKGROUND OF THE INVENTION

Split gate memory devices are known and are disclosed in U.S. Pat. No. 4,868,629 to Eitan and U.S. Pat. No. 5,115,288 to Manley, the contents of which patents are incorporated herein by reference. A conventional split gate memory cell is illustrated in FIG. 1. The cell is programmed when charge is stored in the floating gate 22 and unprogrammed, or erased, when the floating gate 22 is discharged. Such split gate devices are particularly suitable for flash memory arrays, which are high-density, non-volatile semiconductor memory arrays. Split gate devices are well suited for flash memories because the structure avoids the problem of over-erasing during unprogramming. Over-erasing occurs when an erroneous reading is provided as a result of erasing, the floating gate potential is sufficiently high so that during a read operation an unselected cell conducts current. However, this advantage of the split gate structure is offset by the disadvantage of increased cell size.

As shown in FIG. 1, L=total channel length; L2=portion of channel under the floating gate; L1=portion of channel not under the floating gate. L1 is known as the isolation transistor channel length.

The Eitan patent discloses a process for fabricating a split gate memory device as shown in FIG. 1. Eitan discloses using a photoresist pattern to cover part of the floating gate and the channel region of the isolation transistor during the source/drain N$^+$ implant. This method has two drawbacks. First, the total channel length L cannot be controlled easily to allow a consistent length, because the length L depends on photolithography alignment and CD (critical dimension) loss which may be imprecise. Second, the total channel length (and thus the overall cell size) tends to be enlarged due to the same imprecisions in the photolithography process.

The Manley patent also discloses a process for fabricating a split gate memory device as shown in FIG. 1. Manley discloses using a polycrystalline silicon ("poly") spacer to self-align the isolation transistor channel region, which results in a consistent channel length. This method, too, has two drawbacks. First, an extra poly layer is required. Second, this method requires a difficult photo masking step wherein photoresist covers half of the floating gate 22 when removing the poly spacer.

Moreover, the devices disclosed in both the Eitan and Manley patents disclose the gate and isolation transistors in series. This two-transistor-in-series structure has a larger cell size than a single transistor structure, which results in size disadvantages in high density memory applications.

Therefore, it is an object of the present invention to provide a split gate memory device having a vertically oriented floating gate to reduce overall cell size and allowing a denser memory array.

It is a further object of the present invention to provide a fabrication method which overcomes the drawbacks of prior art methods.

SUMMARY OF THE INVENTION

The present invention achieves these and other objects by providing a split gate memory device having a semiconductor substrate of a first conductivity type and with a surface and a trench formed therein. A first heavily doped region (a source for example) having a second conductivity type opposite the first conductivity type is formed on the substrate. A second heavily doped region (a drain for example) also having the second conductivity type, is formed on the bottom surface of the trench. A floating gate is formed on a sidewall of the trench. A control gate is formed above the substrate surface and the trench. A vertical channel exists between the source and the drain regions on the substrate surface and the bottom surface of the trench.

A method of fabricating a split gate memory device is also provided. This method comprises the following steps:

forming a trench in a semiconductor substrate having a top surface;

masking a portion of the top surface adjacent to the trench;

forming heavily doped regions on a bottom surface of the trench and the substrate top surface, except for the masked portion;

forming a floating gate on the sidewall of the trench; and forming a control gate above the trench and the substrate top surface.

The step of masking may further include self-aligning an isolation transistor channel between the floating gate and the source. Also, because the floating gate is formed on a sidewall of the trench, the step of forming the trench may also include defining the length of the floating gate.

The vertical split gate memory device of the present invention decreases the cell size and allows denser memory arrays using the split cell structure. The present invention is also directed to a process for fabricating a vertical split gate memory device which provides greater control of the production process, resulting in a more uniform array.

BRIEF DESCRIPTION OF THE DRAWINGS

These and other objects of the invention will be understood in more detail in conjunction with the following drawings.

DETAILED DESCRIPTION OF A PREFERRED EMBODIMENT

Figure 2:
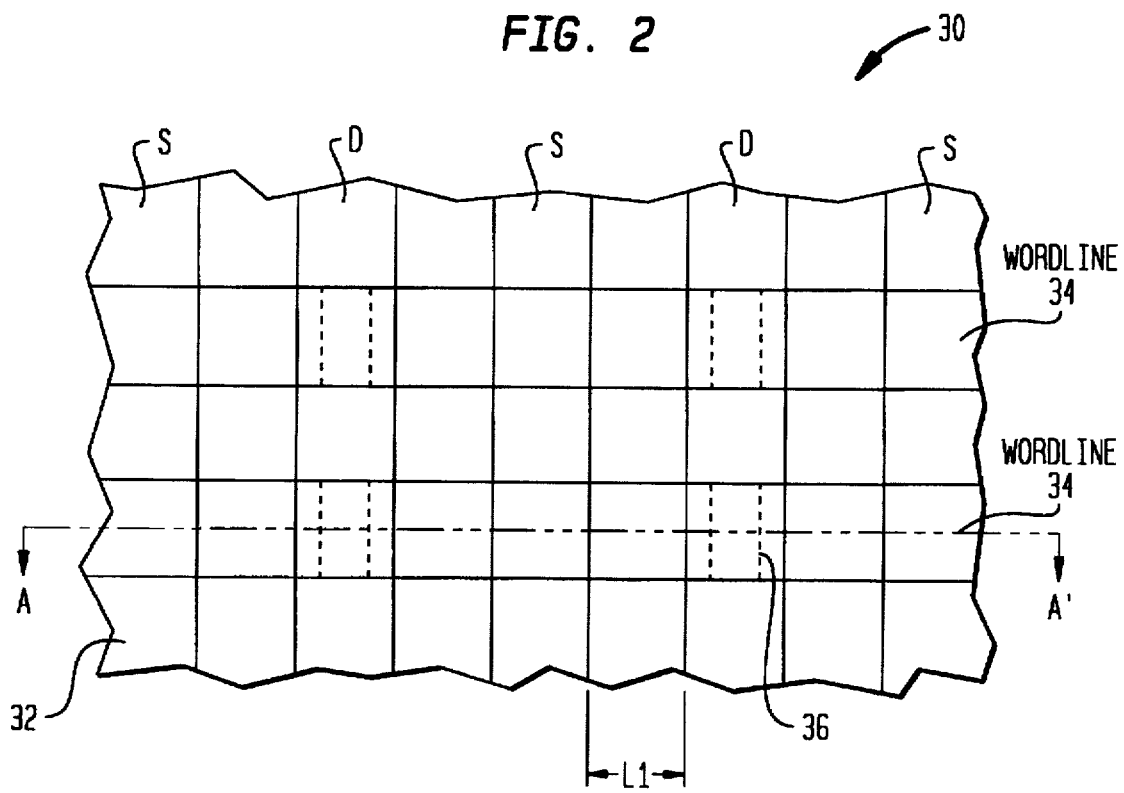
FIG. 2 illustrates a top plan view of a section of a memory array having memory cells according to the present invention.

FIG. 2 illustrates a top view of a portion of a memory array 30 according to one embodiment of the present invention. The array comprises a silicon substrate 32 and a plurality of bit lines (sources S and drains D). The lines labelled S are located at the substrate surface; the lines labelled D are located at the bottom of trenches formed in the substrate, as described below. Illustratively, the substrate is p-type and the sources S and drains D are of the opposite conductivity, e.g., here they are N⁺. A plurality of polycrystalline silicon word lines 34 are formed on the surface of the substrate 32 perpendicular to the bitlines. The channel of each cell is located at the intersection of a wordline 34 and a bit line labelled D. These channels extend vertically between the wordlines on the substrate surfaces and the drains at the trench bottoms. A floating gate 36 (represented in FIG. 2 by dashed lines) for each cell is formed on the sidewall of the trench between the wordline 34 and the drain D.

Figure 1:
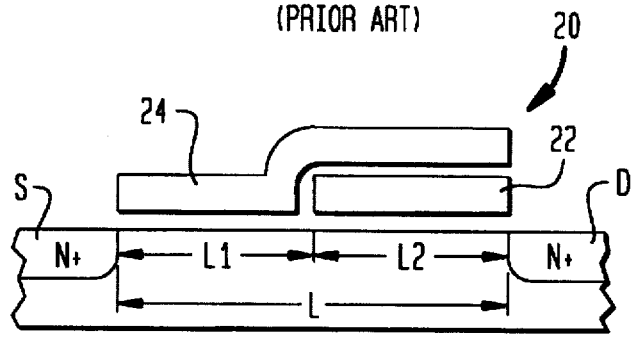
FIG. 1 illustrates a cross section of a prior art split gate memory device.

In the present invention, the floating gate 36 is located vertically above the drain D and there is no channel under the floating gate; thus there is no L2 as seen in FIG. 1. Therefore, the channel length L is substantially equal to L1.

FIGS. 3–9 illustrate a preferred method of fabricating a split gate memory device 20 having a horizontal floating gate.

Figure 3:
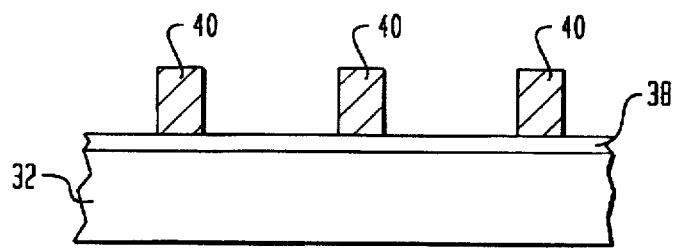
FIGS. 3–9 illustrate a cross-section of the split gate memory device shown in FIG. 2 taken along line AA' at various stages of a process for making one embodiment of the present invention.

As shown in FIG. 3, the starting point is a silicon substrate 32 which, for illustrative purposes, is of P-type. The substrate could alternatively be of N-type. The substrate 32 is doped with boron atoms and has a doping concentration of approximately 1.0 E15/cm³. A first insulation layer 38, for example PAD oxide ($SiO_2$), having a thickness of about 100 to 1000 Ångstroms, is deposited on the surface of the substrate. A poly layer preferably having a thickness in the range of 2000–8000 Ångstroms is then deposited on the insulation layer 38. This poly layer is a "sacrificial poly layer" which will be etched off. Therefore, it does not need to be doped, nor is the quality of the poly material essential. The poly layer is masked and etched to leave poly material stripes 40 as shown in FIG. 3.

Figure 4:
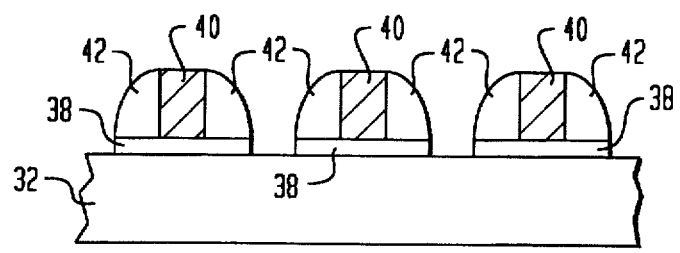

A second insulation layer, for example CVD (chemical vapor deposition) oxide is deposited onto the first insulation layer 38 surface. This layer preferably has a thickness between 2000–8000 Ångstroms. The thickness of the CVD oxide layer decides the final spacer width ($L_1$). Thus, the width of $L_1$ is preferably approximately equal to the thickness of the CDV oxide layer 38. This second insulation layer is anisotropically etched to form oxide spacers 42 on either side of the poly material stripes 40, as seen in FIG. 4. Next, the exposed portions of the first insulation layer 38 are etched away. The result of these steps is seen in FIG. 4.

Figure 5:
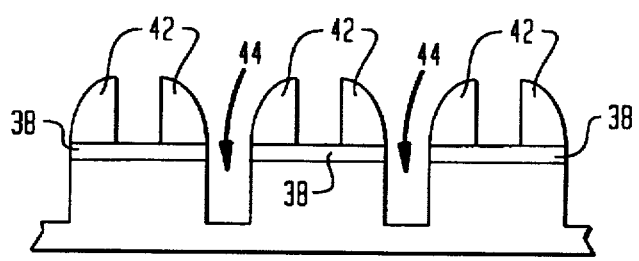
Figure 6:
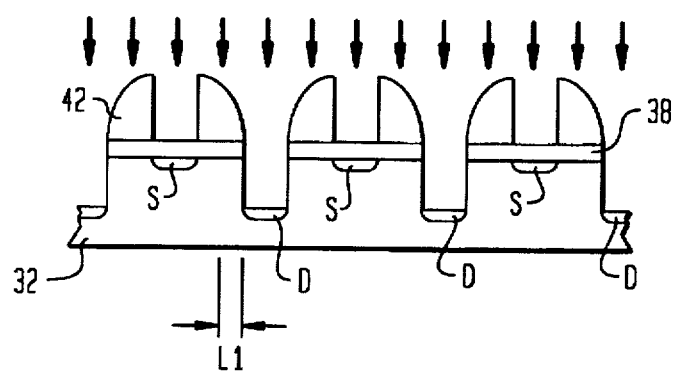

The poly material stripes 40 and the portions of substrate not protected by the first insulation layer are etched away, as seen in FIG. 5. The oxide spacers 42 act as a mask to self-align trenches 44 in the substrate 32, the purpose of which is discussed in more detail below. The depth of the trenches 44 is selected to be the floating gate length L2, as will also be discussed below. This depth is preferably between 0.2–0.8 μm.

The portions of substrate 32 not covered by the oxide spacers 42 are doped to be an opposite conductivity of the substrate. In this illustrative embodiment because the substrate 32 is P-type, the exposed portions are doped to be N⁺ type. Arsenic can be implanted using ion implantation at 30–100 KeV and a dose of between 1 and 8·10¹⁵/cm². The oxide spacers 42 act as self-aligned masks during this doping process, which process forms the source S and drain D regions. That is, the portions of substrate 32 covered by the oxide spacers 42 will not be doped.

Figure 7:
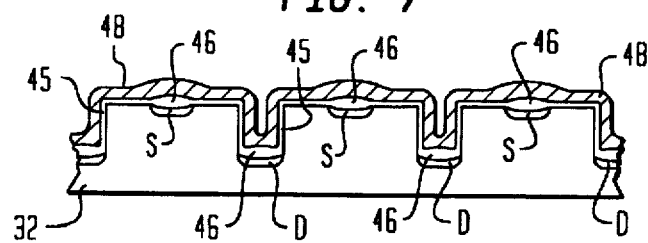

The oxide spacers 42 and the remainder of the first insulation layer 38 are etched away. An oxidation layer is then thermally grown or otherwise deposited on the exposed surfaces. This oxide layer comprises a gate oxide region 45, which is preferably between 80–150 Ångstroms, and a field oxide region 46 formed over the doped areas, (i.e., the sources S and drains D) which is preferably between 200–600 Ångstroms. A second layer of polycrystalline silicon material (poly 2) 48 is deposited onto the surface of the oxide layer 45, 46. Preferably, this poly 2 layer 48 is between 1000–4000 Ångstroms. This poly 2 layer 48 is then doped with $POCl_3$ at 800°–900° C. for 10–30 minutes. The result of these steps is seen in FIG. 7.

Figure 8:
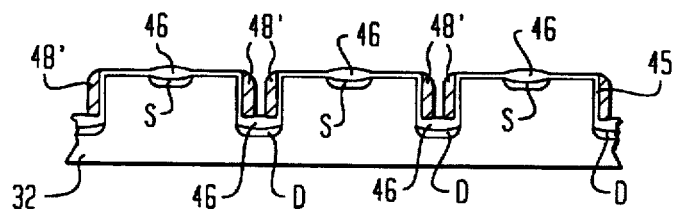

The poly 2 layer 48 is anisotropically etched to form poly 2 spacers 48' in the trenches, as seen in FIG. 8.

Figure 9:
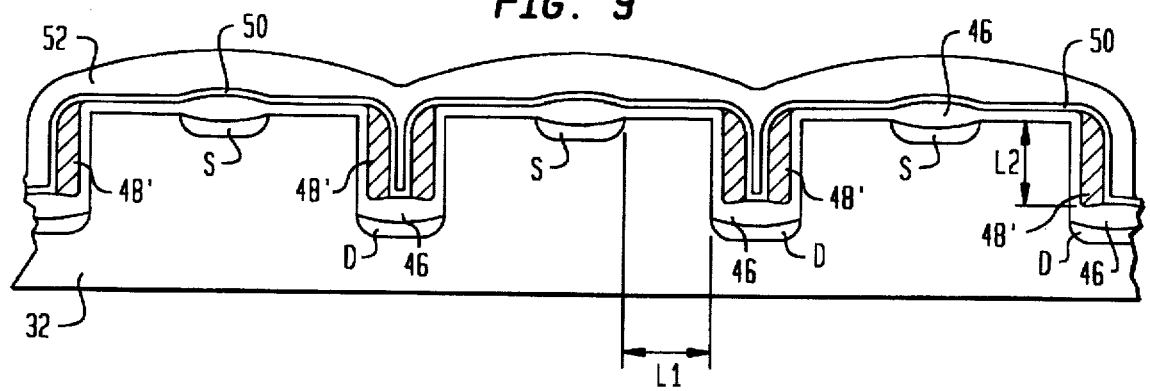

Next, a dielectric layer 50, preferably ONO (oxide-nitride-oxide) is deposited onto the exposed surfaces of the device. This dielectric layer is preferably about 200 Ångstroms thick. A third layer of poly material (poly 3) 52 is deposited onto the surface of the dielectric layer 50. The poly 3 layer is then doped with $POCl_3$ at 85°–950° C. for 10–30 minutes. The result of these steps is shown in FIG. 9. This poly 3 layer 52 is then masked and etched to become the word lines 34 shown in FIG. 2. The poly 3 layer 53 may also be a polycide material (poly+silicide), such as $WSi_2$ or $TaSi_2$.

The rest of the processes for completing the split gate memory array are entirely conventional back-end processes including BPSG, contacts, and metalization.

Figure 10:
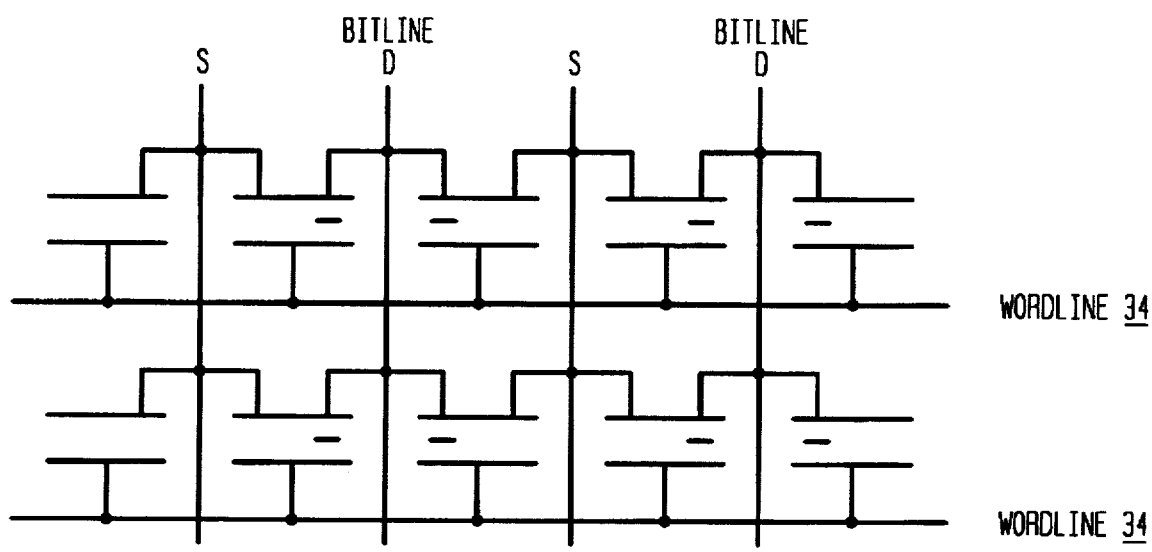
FIG. 10 schematically illustrates a memory array according to a preferred embodiment of the present invention.

FIG. 10 is a schematic representing a portion of memory array according to the present invention. This schematic shows the word line 34 connection to the gate and the drains D and sources S, which are bit lines.

FIG. 9 shows the substrate 32 having a conductivity type (here P-type) with source S and drain D regions heavily doped to have the opposite conductivity type (here N⁺ type) at the substrate surface and trench bottom, respectively. A floating gate 48' is formed vertically on sidewall of the trench, above the drain D. The control gate 52 is formed above the substrate 32.

As shown in FIG. 9, the split gate memory device has an isolation transistor channel length L1 which is horizontally oriented. The floating gate 48', however, is formed vertically inside the trench and is generally perpendicular with respect to isolation transistor channel, thus reducing the surface area of the overall memory cell. Because the horizontal portion of the channel length L is greatly reduced, the surface area of each memory cell is decreased. The drain D is also a bitline and is formed in the trench and thus retains the advantages well known for buried bitline memory devices such as reduced surface area. Thus, the split gate memory device according to the present invention is suitable for use in high density memory applications.

The fabrication process is superior to prior art techniques because the length L2 is controlled by the trench etch depth, which may be substantially precisely controlled. This allows greater control and consistency during fabrication than conventional split gate cell fabrication methods, such as disclosed in the '629 patent to Eitan.

When using a split gate memory cell of the present invention, for example as a flash memory, it is programmed as follows:

$V_{w/l}$=12V;

$V_{drain}$=7V; and $V_{source}$=0V;

where $V_{w/l}$ is the voltage on the wordline 34. In this state, electrons will be injected into the floating gate 48' by hot-channel electrons, which will increase the transistor threshold voltage $V_T$ of the split gate cell into the high state.

When using a split gate memory cell of the present invention, for example as a flash memory, it is read as follows:

$V_{w/L} = 5V$;

$V_{drain} = 1V$; and $V_{source} = aV$

When using a split gate memory cell of the present invention, for example as a flash memory, it is erased as follows:

$V_{w/l} = -5V$; and $V_{drain} = V_{source} = V_{substrate} = 10V$;

where $V_{substrate}$ is the voltage on the substrate where the substrate is used as a terminal. The high voltage on the drain, source, and substrate pull the electrons out of the floating gate 48' and return $V_T$ to a low state.

The isolation transistor prevents the split gate cell from having leakage current even if the floating gate electrons are "over-erased", that is, if $V_T$ is a negative voltage. Thus, the over-erase problem is avoided.

The above described embodiments of the invention are intended to be illustrative only. Numerous alternative embodiments may be devised by those skilled in the art without departing from the spirit and scope of the following claims.

What is claimed is:

1. A split gate memory device, comprising:

a) a semiconductor substrate of a first conductivity type having a surface and a trench having a bottom surface, sidewalls, and top formed therein;

b) a first heavily doped region of semiconductor material formed in the substrate surface having a second conductivity type opposite to said first conductivity type;

c) a second heavily doped region of semiconductor material formed in said substrate at the bottom surface of said trench and having the second conductivity type, the second region configured to form part of a bitline, each of said first and second regions forming either one of a drain and a source;

d) a floating gate formed on a sidewall of the trench; and e) a control gate formed generally perpendicular to the floating gate and above the substrate surface and above and across the top of the trench.

2. The split gate memory device of claim 1, wherein the floating gate comprises doped polycrystalline silicon.

3. The split gate memory device of claim 1, wherein the first and second heavily doped regions are each a source of dopant material.

4. The split gate memory device of claim 1, wherein the first region in the substrate surface forms the source.

5. The split gate memory device of claim 1, wherein the second region at the bottom surface of the trench forms the drain.

6. The split gate memory device of claim 1, wherein the control gate forms part of a word line.

7. The split gate memory device of claim 1, wherein the control gate comprises doped polycrystalline silicon, the floating gate comprises doped polycrystalline silicon, the semiconductor substrate comprises P-type silicon, and the first and second heavily doped regions comprise polycrystalline silicon doped with one of either As and $POCl_3$.

8. The split gate memory device of claim 1, wherein a dielectric layer is located directly below the control gate.

9. The split gate memory device of claim 1, wherein an oxide layer is located above the semiconductor substrate surface and the trench.

10. The split gate memory device of claim 1, further comprising a channel between the first and second heavily doped regions.

11. The split gate memory device of claim 10, wherein the floating gate and the channel are generally perpendicular to each other.

* * * * *